United States Patent
Sander

(10) Patent No.: US 7,408,398 B2
(45) Date of Patent: Aug. 5, 2008

(54) CIRCUIT ARRANGEMENT HAVING A POWER TRANSISTOR AND A DRIVE CIRCUIT FOR THE POWER TRANSISTOR

(75) Inventor: Rainald Sander, München (DE)

(73) Assignee: Infineon Technologies AG, Munich (DE)

( * ) Notice: Subject to any disclaimer, the term of this patent is extended or adjusted under 35 U.S.C. 154(b) by 30 days.

(21) Appl. No.: 11/109,318

(22) Filed: Apr. 19, 2005

(65) Prior Publication Data

US 2006/0006922 A1 Jan. 12, 2006

(30) Foreign Application Priority Data

Apr. 19, 2004 (DE) .......................... 10 2004 018 823

(51) Int. Cl.
*H03K 17/687* (2006.01)
(52) U.S. Cl. ........................ 327/427; 327/437
(58) Field of Classification Search ................ 327/427, 327/430–431, 434, 437
See application file for complete search history.

(56) References Cited

U.S. PATENT DOCUMENTS

| | | | | |
|---|---|---|---|---|
| 4,540,893 A | | 9/1985 | Bloomer ...................... | 327/432 |
| 5,166,543 A | * | 11/1992 | Schneider et al. ............ | 327/518 |
| 5,422,559 A | * | 6/1995 | Hall et al. .................... | 320/139 |
| 5,469,094 A | * | 11/1995 | Nessi .......................... | 327/110 |
| 5,656,969 A | * | 8/1997 | Pulvirenti et al. ............ | 327/561 |
| 5,781,040 A | * | 7/1998 | Myers ......................... | 327/44 |
| 6,094,079 A | * | 7/2000 | Boggs et al. ................. | 327/172 |
| 6,407,594 B1 | * | 6/2002 | Milazzo et al. .............. | 327/112 |
| 6,556,407 B2 | | 4/2003 | Brando et al. ............... | 361/100 |
| 6,650,094 B2 | * | 11/2003 | Feldtkeller .................. | 323/225 |
| 6,873,201 B2 | * | 3/2005 | Panhofer ...................... | 327/427 |

(Continued)

FOREIGN PATENT DOCUMENTS

DE 198 29 837 A1 1/2000

(Continued)

OTHER PUBLICATIONS

Tietze et al., "Halbleiter-Schaltungstechnik [Semiconductor Circuitry]", Springer Verlag, 9th Edition, p. 235.

*Primary Examiner*—Kenneth B. Wells
(74) *Attorney, Agent, or Firm*—Maginot, Moore & Beck

(57) ABSTRACT

Circuit arrangement having a power transistor and a drive circuit for the power transistor The invention relates to a circuit arrangement having the following features:
  a power transistor (T) having a control terminal (G) and also a first and second load path terminal (D, S), the first load path terminal (D) of which is connected to a terminal for supply potential (V1) via an inductance-exhibiting line terminal (1) and the second load path terminal (S) of which serves for connecting a load (Z), and
  a first drive unit (10) for off-state driving of the power transistor (T) having an output (11) connected to the control terminal (G) of the power transistor (T1), and having a first current source arrangement (Iq1) connected between the output (AK) and a first drive potential (GND), in which case
  the first drive unit has a second current source arrangement (S2off, Iq2; S2off, Iq2, Iq21), which is connected to the output (AK) and which provides a current (I2; I2, I21) that is dependent on a temporal change in a terminal potential (Vd) at the first load path terminal (D) of the power transistor (T).

19 Claims, 6 Drawing Sheets

U.S. PATENT DOCUMENTS

| | | | |
|---|---|---|---|
| 7,034,600 B2* | 4/2006 | Scheikl | 327/376 |
| 7,075,804 B2* | 7/2006 | Shearon et al. | 363/49 |
| 2001/0035743 A1 | 11/2001 | Feldtkeller | 323/282 |
| 2001/0040470 A1 | 11/2001 | Brando et al. | 327/109 |

FOREIGN PATENT DOCUMENTS

| | | |
|---|---|---|
| DE | 198 55 604 C1 | 6/2000 |
| DE | 102 40 167 A1 | 3/2004 |

* cited by examiner

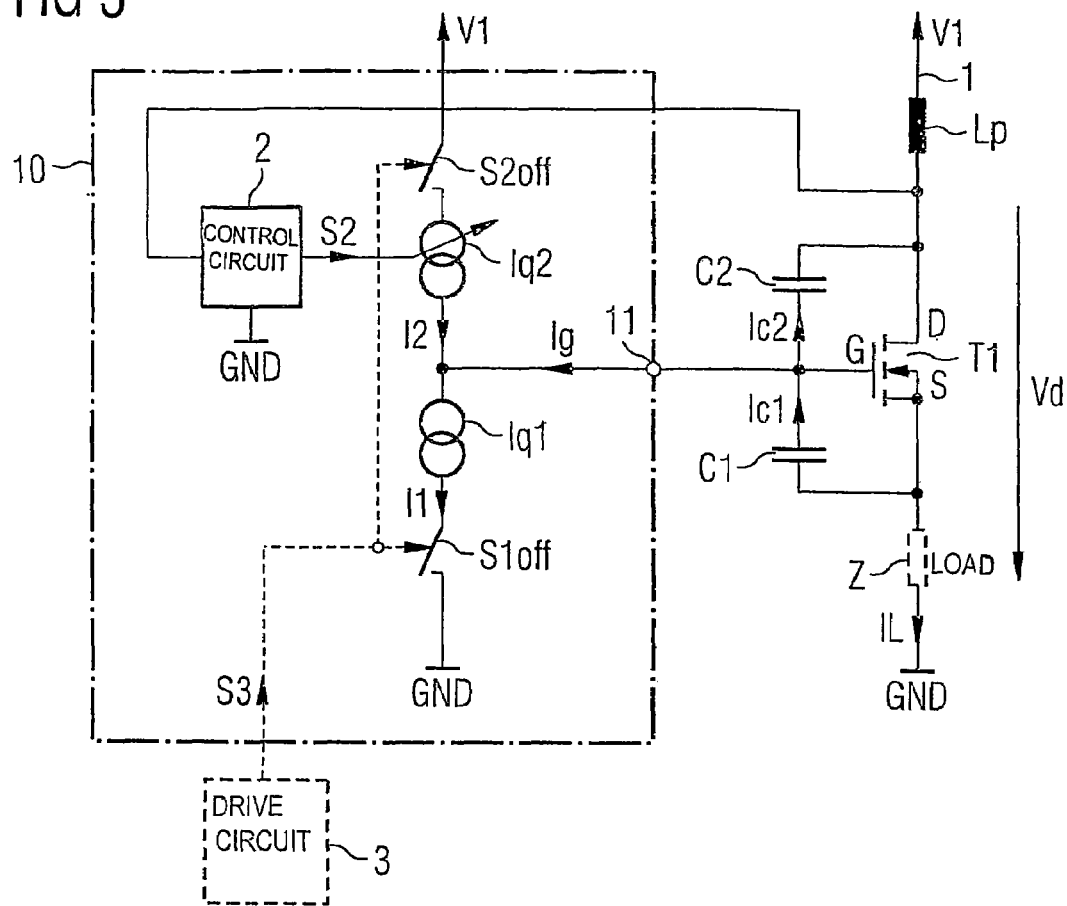
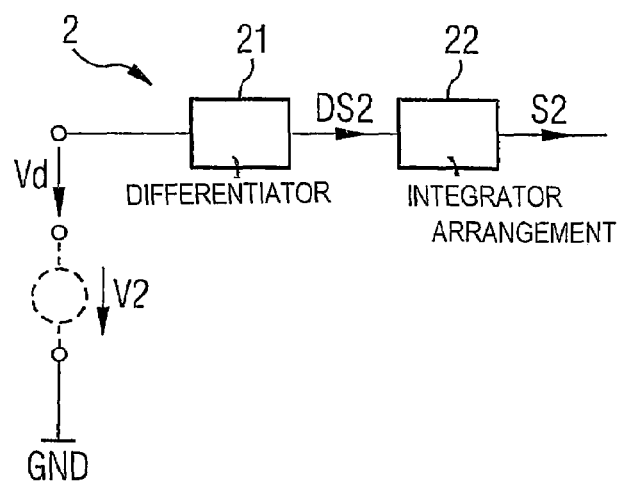

FIG 8
a)
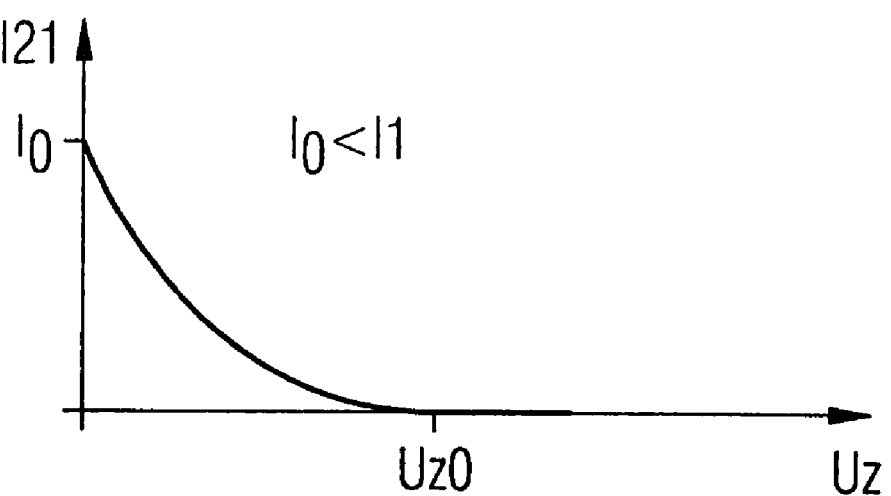
b)
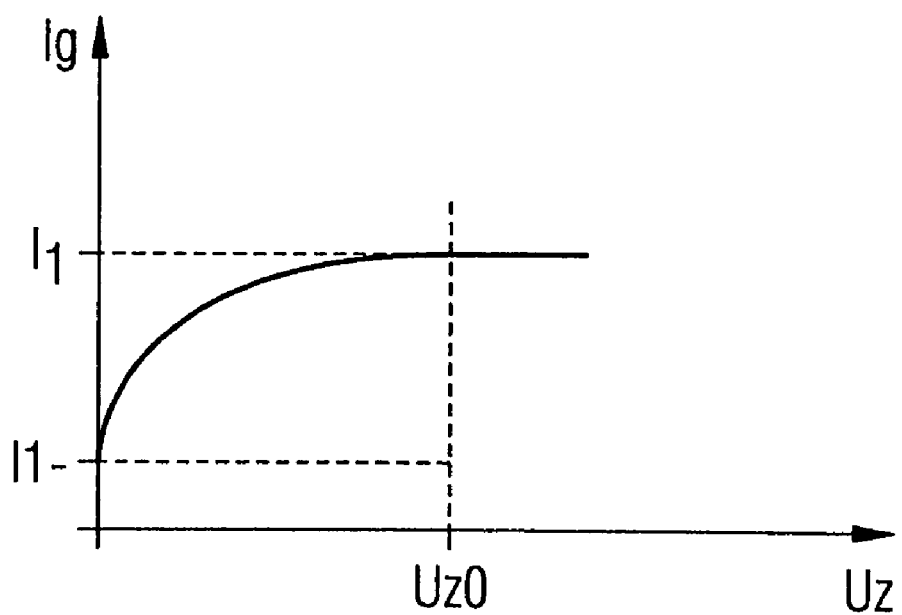

CIRCUIT ARRANGEMENT HAVING A POWER TRANSISTOR AND A DRIVE CIRCUIT FOR THE POWER TRANSISTOR

FIELD OF THE INVENTION

The present invention relates to a circuit arrangement having a power transistor and a drive circuit for driving the power transistor.

BACKGROUND

Such circuit arrangements having a power transistor and a drive circuit with current sources for driving the power transistor are sufficiently known and, for example, are described in DE 198 55 604 C1.

During the switching of power transistors, voltage and current changes arise at the load and in the supply and connecting lines to the load and the power transistor, which changes lead to electromagnetic interference emissions. In order to avoid or reduce said interference emissions, it is known to flatten the voltage edges of a voltage that changes across the power transistor or across the load during switching by means of suitable driving of the power transistor. For this purpose, DE 198 55 604 C1 mentioned above discloses subdividing driving operations for on-state or off-state driving of the power transistor into different temporal phases during which different charging or discharging currents are made available for a drive electrode of the transistor. In order to define the beginning and end of these individual phases, a voltage across the load and a load current flowing through the load are compared with predetermined threshold values.

U.S. Pat. No. 4,540,893 likewise describes a circuit arrangement having a power transistor, a drive circuit for the power transistor and a load connected in series with the power transistor. This circuit arrangement takes account of a temporal change dI/dt in a load current I flowing through a load or a temporal change dV/dt in a voltage V across the load in the generation of a charging or discharging current of the power transistor.

For the purpose of driving a power transistor connected in series with a load with the aim of flattening the switching edges, DE 102 40 167 A1, moreover, provides a charging current or a discharging current which has a constant component and a component dependent on the voltage across the load. The variable component in each case counteracts the constant component and is related to the load voltage via a nonlinear characteristic curve, the variable component increasing continuously as the load voltage decreases. This has the effect that during off-state driving of the power transistor, the drive electrode thereof is initially discharged with a large discharging current and, as the voltage across the load decreases, is discharged with a continuously decreasing discharging current.

However, parasitic inductances of terminal lines can counteract the known measures for flattening the switching edges, as is explained below.

FIG. 1 shows a circuit arrangement having a power transistor T10 designed as a MOSFET, which has a gate terminal G and a drain-source path D-S, having a load Z connected in series with the load path D-S of the power transistor. The gate terminal G forms the control terminal and the drain-source path forms the load path of the transistor. The transistor T10 functions as a high-side switch whose drain terminal D is connected to a positive supply potential V1 via a power terminal and to whose source terminal S the load is connected, which is connected to a negative supply potential or reference-ground potential GND via a terminal remote from the transistor T10. The terminal line 1 has a parasitic inductance, designated by the reference symbol Lp in FIG. 1.

The transistor T1 inherently has a gate-source capacitance C1 and a drain-gate capacitance C2, which is also referred to as the Miller capacitance. The transistor T1 turns on if the gate-source capacitance C1 is charged to a value greater than the threshold voltage. In order to turn the transistor T1 off, said gate-source capacitance C1 has to be discharged with a suitable discharging current.

FIG. 2a schematically illustrates the temporal profile of a load current flowing through the transistor T1 and the load during such a turn-off operation for the transistor t1. In FIG. 2a, t1 designates an instant at which a fall in the load current commences proceeding from an initial value. This instant corresponds approximately to the instant at which the gate-source capacitance C1 is discharged to the value of the threshold voltage of the transistor by a discharging current Ig depicted in FIG. 1. t3 designates an instant at which the turn-off operation is concluded and the load current IL has fallen to zero.

The parasitic inductance Lp brings about a change in the drain potential Vd of the transistor T during the turn-off operation. This potential Vd corresponds to the supply potential V1 in the case of a transistor T1 that has already been switched on for a relatively long time. A deviation $\Delta Vd = Vd - V1$ of this drain potential Vd with respect to the supply potential V1 is in this case proportional to the temporal change dIL/dt in the load current IL. In this case, the proportionality factor is the inductance value of the parasitic inductance Lp. An instant at which this deviation reaches its maximum value is designated by t2 in FIG. 2. Via the Miller capacitance C2, this temporal change in the drain potential Vd leads to a parasitic current Ic2 to the gate electrode G from the gate electrode G which is proportional to a temporal change in the drain potential Vd. In this case, the proportionality factor corresponds to the value of the Miller capacitance C2. During a first time segment between the instants t1 and t2 between which the temporal change in the load current increases continuously, said parasitic current Ic2 counteracts the discharging current Ig and thereby slows down the discharge. During a second segment between the instants t2 and t3 between which the change in the load current decreases continuously up to the conclusion of the switch-off operation, the parasitic current Ic2 acts with the discharging current Ig and thereby accelerates the discharging of the gate-source capacitance.

However, it is precisely during this second time segment that a reduction of the discharging current is desirable, rather, in order to achieve a flattening of the load current curve. Thus, in particular, the drive circuit in accordance with DE 102 40 167 A1 mentioned above is designed to reduce the discharging current in the time segment shortly before the load current falls to zero. However, the parasitic effects explained counteract this reduction of the discharging current.

SUMMARY

It is an aim of the present invention to provide a circuit arrangement having a power transistor and a drive circuit in which electromagnetic interference emissions that occur during the switching, in particular during the turn-off, of the power transistor are effectively reduced.

This object is achieved by means of a circuit arrangement having a power transistor and a drive circuit for the power transistor having the features of the embodiments of the invention.

The circuit arrangement comprises a power transistor having a control terminal and also a first and second load path terminal, a first load path terminal of which is connected to a terminal for supply potential via an inductance-exhibiting power terminal and the second load path terminal of which serves for connecting a load. The circuit arrangement additionally comprises a first drive unit for off-state driving of the power transistor. The first drive unit comprises an output connected to the control terminal of the power transistor, a first current source arrangement connected between the output and a first drive potential, and also a second current source arrangement, which is connected to the output and which provides a current that is dependent on a temporal change in a terminal potential at the first load path terminal of the power transistor.

The current supplied by said second current source arrangement serves at least partly to compensate for a parasitic current that occurs at the control terminal and acts in addition to a discharging current provided by the first current source arrangement as discharging current at the control terminal of the power transistor. Said parasitic current results, in the manner already explained in the introduction, from a parasitic inductance of the supply line of the power transistor in conjunction with the Miller capacitance.

The second current source arrangement is preferably designed to provide a current that is dependent on an integral value formed by upward integration of the temporal change in the terminal potential, proceeding from a first instant, starting from which a rise in the terminal potential is produced on account of the inductance of the line terminal. In this case, the upward integration of the temporal change in the load terminal potential may be effected proceeding from the first instant up to a second instant, at which the load terminal potential reaches a maximum value, in order to obtain an integral value for setting the current. Alternatively, in this case, the upward integration of the temporal change in the load terminal potential may be effected proceeding from the first instant up to an instant after a turn-off operation for the power transistor has ended. Such an instant is distinguished by the fact that a load current through the power transistor has fallen to zero or that the load terminal potential is no longer subject to any temporal changes.

Independently of the generation of the integral value, the second current source arrangement is preferably designed in such a way that the current dependent on the change in the terminal potential does not commence until at the second instant, at which the load potential reaches its maximum value and starting from which the load potential falls over time. Starting from this second instant, the Miller capacitance that is unavoidably present results in an additional discharging current with respect to the discharging current provided by the first current source arrangement. The current of the second current source arrangement which commences starting from the second instant then counteracts this parasitic discharging current.

Preferably, the current supplied by the second current source arrangement is also dependent on a load voltage between the second load path terminal and the first drive potential and is related to said load voltage via a nonlinear characteristic curve. As a result of this, it is possible to achieve a flattening of the switching edges toward the end of the turn-off operation, which has already been described, in principle, in DE 102 40 167 A1 mentioned in the introduction.

Such a current source arrangement which supplies a current having a current component dependent on the temporal change in the terminal potential and having a current component dependent on a load voltage can be realized by connecting two current sources in parallel, one of which provides the current component dependent on the change in the terminal potential and the other of which provides a current component dependent on the load voltage.

Such a current source arrangement may also be realized as a normally on transistor having a load path, a control terminal and a substrate terminal, the load path being connected between the second supply potential and the output terminal, the control terminal being fed a first drive signal dependent on the temporal change in the terminal potential, and the substrate terminal being fed a second drive signal dependent on the load voltage.

BRIEF DESCRIPTION OF THE DRAWINGS

The present invention is explained in more detail below in exemplary embodiments with reference to figures.

FIG. 3 shows a circuit arrangement according to the invention having a power transistor and a drive unit for the power transistor, which has a controlled current source.

FIG. 4 schematically shows the construction of a drive unit for the controlled current source.

FIG. 8 illustrates the relationship between the load voltage and the current component dependent on the load voltage.

DETAILED DESCRIPTION

In the figures, unless specified otherwise, identical reference symbols designate identical structural parts, circuit components and signals with the same meaning.

FIG. 3 shows a first exemplary embodiment of the circuit arrangement according to the invention. The circuit arrangement comprises a power transistor T1 having a control terminal G, and also a first and second load path terminal D, S. In the exemplary embodiment, the power transistor T1 is designed as an n-channel MOSFET whose gate terminal G forms the control terminal, whose drain terminal D forms the first load path terminal and whose source terminal forms the second load path terminal. The MOSFET unavoidably has a gate-source capacitance, depending on the charge state of which the MOSFET turns on or turns off. Said gate-source capacitance is illustrated explicitly in FIG. 3 and designated by the reference symbol C1. However, a gate-drain capacitance is present, which is also referred to as the Miller capacitance and which is likewise illustrated explicitly and designated by the reference symbol C2 in FIG. 3.

The MOSFET T1 is connected up as a high-side switch. For this purpose, the source terminal S of the MOSFET T1 is connected via a load Z to a first supply potential, which forms the reference-ground potential GND of the circuit in the example and which is ground by way of example. The drain terminal D is connected via an inductance-exhibiting line 1 to a second supply potential V1, which represents a positive supply potential in relation to the reference-ground potential GND. The inductive component Lp represents the inductance of this terminal line 1.

The circuit arrangement furthermore comprises a first drive unit 10 for off-state driving of the power transistor T1. The drive unit 10 has an output 11 connected to the gate terminal G of the power transistor T1 and comprises a first current source arrangement Iq1, Sloff connected between the output 11 and reference-ground potential GND. Said current source arrangement comprises a current source Iq1, which provides a discharging current I1, and also a switch Sloff connected in series with said first current source Iq1. Said switch Sloff is closed during a turn-off operation in order to discharge the gate-source capacitance C1 of the power transistor T1 by means of the discharging current I1. Said switch Sloff is driven by a drive signal S3, which represents a turn-off signal for the power transistor T1 and is provided by an arbitrary control circuit, which is not the subject matter of the invention and is therefore illustrated by dashed lines in FIG. 3. It should be pointed out that the current source Iq1 may also be designed as a switchable current source that is driven by the control signal S3. The switch Sloff connected in series with the current source can be dispensed with in this case.

Figure 1:
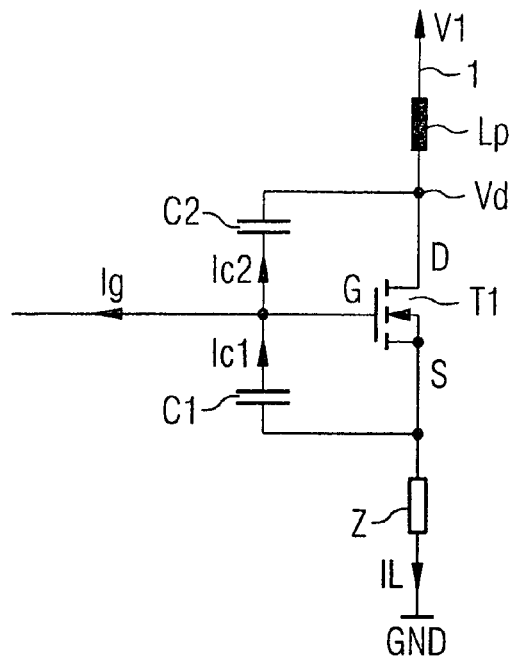
FIG. 1 shows a circuit arrangement having a power transistor, the source terminal of which is connected to a load and the drain terminal of which is connected to a supply potential via an inductance-exhibiting terminal line, according to the prior art.
Figure 2:
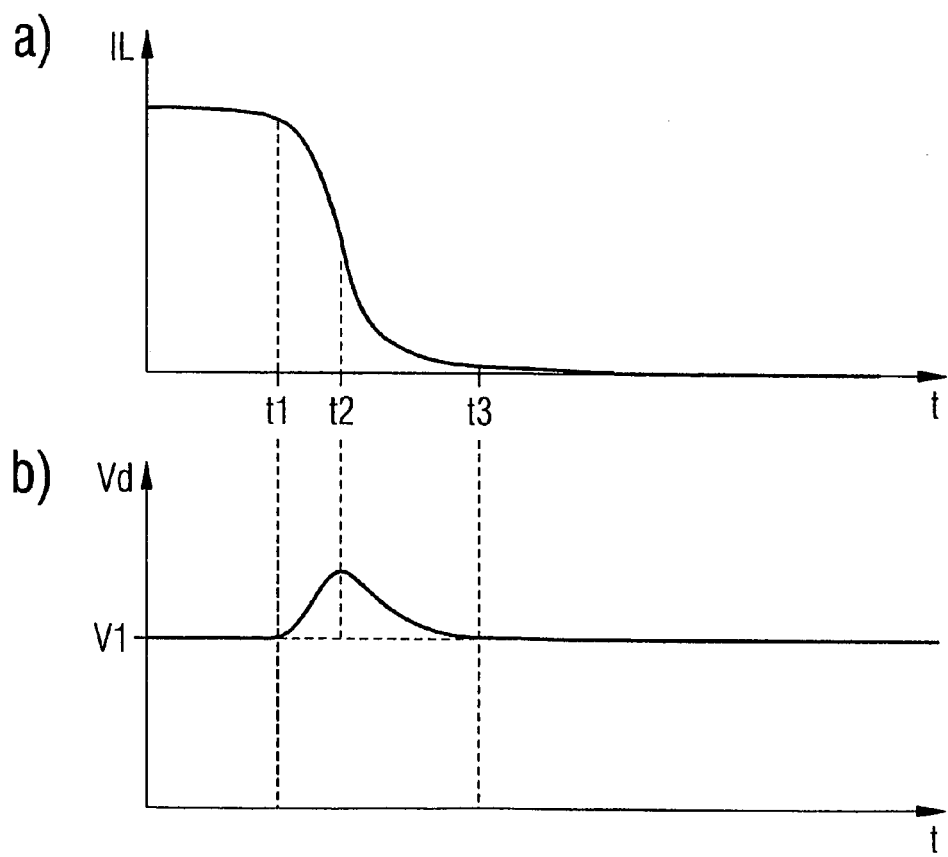
FIG. 2 schematically shows the temporal profile of the load current and also of the drain potential in the case of the circuit arrangement in accordance with FIG. 1 during a turn-off operation for the power transistor.

The first drive unit 10 furthermore comprises a second current source arrangement, having, in the example, a controlled current source Iq2 and a second switch S2off, which are connected in series between the first supply potential V1 and the output 11 of the drive unit 10. Moreover, a drive circuit 2 for driving the controllable current source Iq2 is present, which provides a control signal S2 that drives the current source Iq2. A task of this second current source arrangement is to at least partly compensate for a parasitic discharging current Ic2 that occurs during the turn-off operation. As already explained in the introduction with reference to FIGS. 1 and 2, such a parasitic discharging current Ic2 that discharges the gate-source capacitance C1 arises from a temporal change in the drain potential Vd of the power transistor t1 which leads via the Miller capacitance C2 to said parasitic discharging current Ic2. The temporal change in the drain potential Vd during the turn-off operation results from the voltage induced in the parasitic inductance Lp on account of the temporal change in the load current I1. The temporal profile of the load current IL and of the drain potential Vd which is illustrated qualitatively in FIG. 2 also holds true for the circuit arrangement illustrated in FIG. 3. As already explained, the parasitic discharging current Ic2 flows starting from the instant t2, at which the drain potential Vd reaches its maximum value, in the direction illustrated in FIG. 3 in order to discharge the gate-source capacitance C1 in addition to the discharging current I1.

The second current source arrangement is designed to counteract said parasitic discharging current Ic2. Since the parasitic discharging current Ic2 is dependent on a temporal change in the drain potential Vd, it holds true for the current I2 provided by the second current source arrangement that this current is likewise dependent on the temporal change in the drain potential Vd. The following thus holds true:

$$I2 = f(dVd/dt) \quad (1)$$

In order to determine the temporal dependence of the drain potential Vd, the drive circuit 2 is coupled to the drain terminal D of the power transistor T1. This control circuit 2 may be designed to provide a control signal S2 that is proportional to the temporal change in the drain potential vd, so that the following holds true for the second current I2 given a portionality between control signal S2 and second current I2:

$$I2 \sim -\frac{dVd}{dt} \quad (2)$$

In the case of this exemplary embodiment, a current I2 flows between the first and second instants t1, t2 counter to the direction illustrated in FIG. 3 in order to counteract the parasitic charging current Ic2 that flows during this time period counter to the direction depicted in FIG. 3. At the instant t2, this compensation current reaches the value zero in order then to flow in the direction depicted in FIG. 3 and to at least partly compensate for the parasitic discharging current Ic2.

Simulations of the circuit have shown that it is advantageous to provide a second compensation current I2 not equal to zero as early as at the second instant t2 when the discharging current Ic2 begins to flow in the direction depicted in FIG. 3. Therefore, one exemplary embodiment of the invention provides, for the generation of the control signal S2, for upward integration of temporal changes in the drain potential Vd between the first and second instants t1, t2 in order to supply a compensation current I2 starting from the second instant t2. Said compensation current I2 is preferably zero before the second instant t2, so that the following holds true:

$$I2 = 0 \text{ for } t < t2 \quad (3a)$$

$$I2 \sim -\int_{t1}^{t2} \frac{dVd}{dt} \text{ for } t \geq t2 \quad (3b)$$

FIG. 4 schematically shows a control circuit 2 for generating a drive signal S2 for the current source Iq2 for this case. The drive circuit 2 comprises a differentiator 21, to which the drain potential Vd is fed and which provides an output signal DS2 that is dependent on the temporal change in the drain potential Vd. An offset voltage source is advantageously connected upstream of the input of the differentiator 21, which offset voltage source provides an offset voltage V2 and is connected in such a way that the input signal which is fed to the differentiator is not a voltage corresponding to the drain potential Vd but rather a smaller differential voltage resulting from the difference between the drain potential Vd and the offset voltage V2. Said offset voltage V2 preferably corresponds to the positive supply potential V1 in order to eliminate the DC component of the drain potential Vd, which has no effect anyway on the temporal differentiation carried out by the differentiator 21. Connected downstream of the differentiator 21 is an integrator arrangement 22, to which the differentiator output signal DS2 is fed and which provides the control signal S2.

Figure 5:
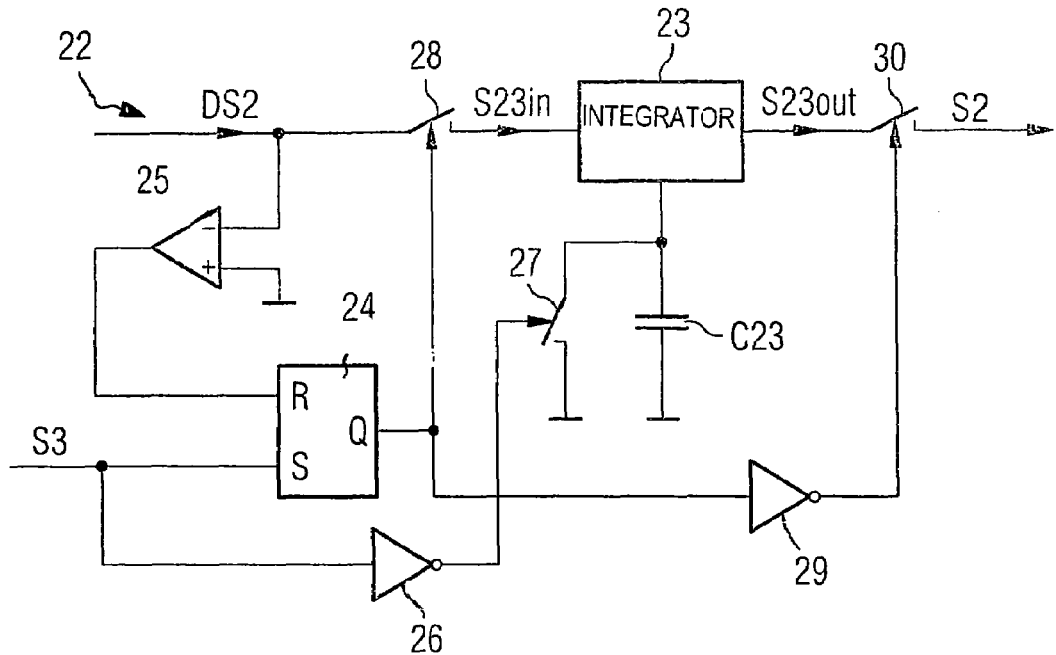
FIG. 5 shows a first exemplary realization of an integrator circuit that is part of the drive circuit.

An exemplary realization of said integrator arrangement 22 is illustrated in FIG. 5. The integrator arrangement 22 comprises a customary integrator 23 such as is described for example in Tietze, Schenk: "Halbleiter-Schaltungstechnik" [Semiconductor Circuitry"], 9th Edition, Springer Verlag, page 325. The reference symbol C23 designates a capacitive storage element C23 associated with the integrator. The differentiator signal DS2 is fed to the integrator 23 via a switch 28 driven by a flip-flop 24. The switch-off signal S3 is fed to the set input of said flip-flop 24 in order to close the switch 28 at the beginning of the switch-off operation, it being assumed for the purposes of the explanation that the switch-off signal S3 assumes a high level at the beginning of the switch-off operation for the power transistor T1 and the flip-flop 24 is set upon a rising edge of the switch-off signal S3. The differentiator signal DS2 is subjected to upward integration by the integrator 23 with the closing of the switch 28, in order to provide an integrator output signal S23out. In order that the differentiator output signal DS2 is subjected to upward integration only until the second instant t2, at which the differentiator signal DS2 becomes zero or at which the drain potential Vd reaches its maximum value, during the turn-off operation, a comparator 25 is provided, which detects the zero crossing of the differentiator signal DS2 and resets the flip-flop 24 in order to open the switch 28 upon detection of the zero crossing. With the opening of the switch 28, a further switch 30, which is connected downstream of the integrator 23 and is driven by the output signal of the flip-flop 24 via an inverter, is closed in order to output the integrator output signal S23out as control signal S2 for the current source Iq2 starting from the instant t2. Said output signal S23out is proportional to the integral in accordance with equation 3b. The integrator 23 maintains the output value obtained by upward integration of the differentiator signal DS2 until, at the end of the switch-off period, when the switch-off signal S3 assumes a low level, a switch 27 connected in parallel with the capacitor C23 is closed. Said switch 27 is driven by the switch-off signal S3 via an inverter 26.

The second current source arrangement advantageously generates the compensation current I2 in such a way that the latter decreases toward the end of the turn-off operation. This can be achieved by generating the compensation current I2 in accordance with the following relationship:

$$I2 = 0 \text{ for } t < t2 \quad (4a)$$

$$I2 \sim \int_{t1}^{t3} \frac{dVd}{dt} dt \text{ for } t \geq t2 \quad (4b)$$

Figure 6:
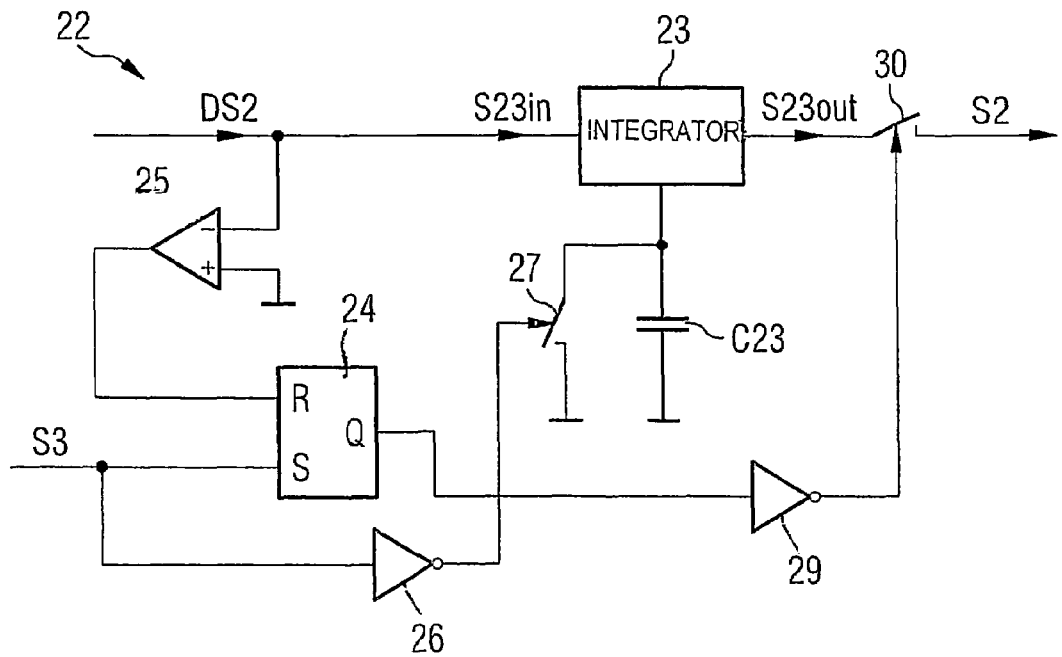
FIG. 6 shows a second exemplary realization of an integrator circuit.

A control signal S2 for the generation of such a compensation current I2 by the current source Iq2 may be generated by means of a control circuit comprising the integrator arrangement 22 illustrated in FIG. 6. This integrator arrangement differs from that illustrated in FIG. 5 by virtue of the fact that the switch 28 upstream of the integrator 26 is dispensed with, so that the differentiator signal is also subjected to upward integration beyond the second instant t2. The compensation current I2 thereby assumes the value zero at the third instant t3.

Figure 7:
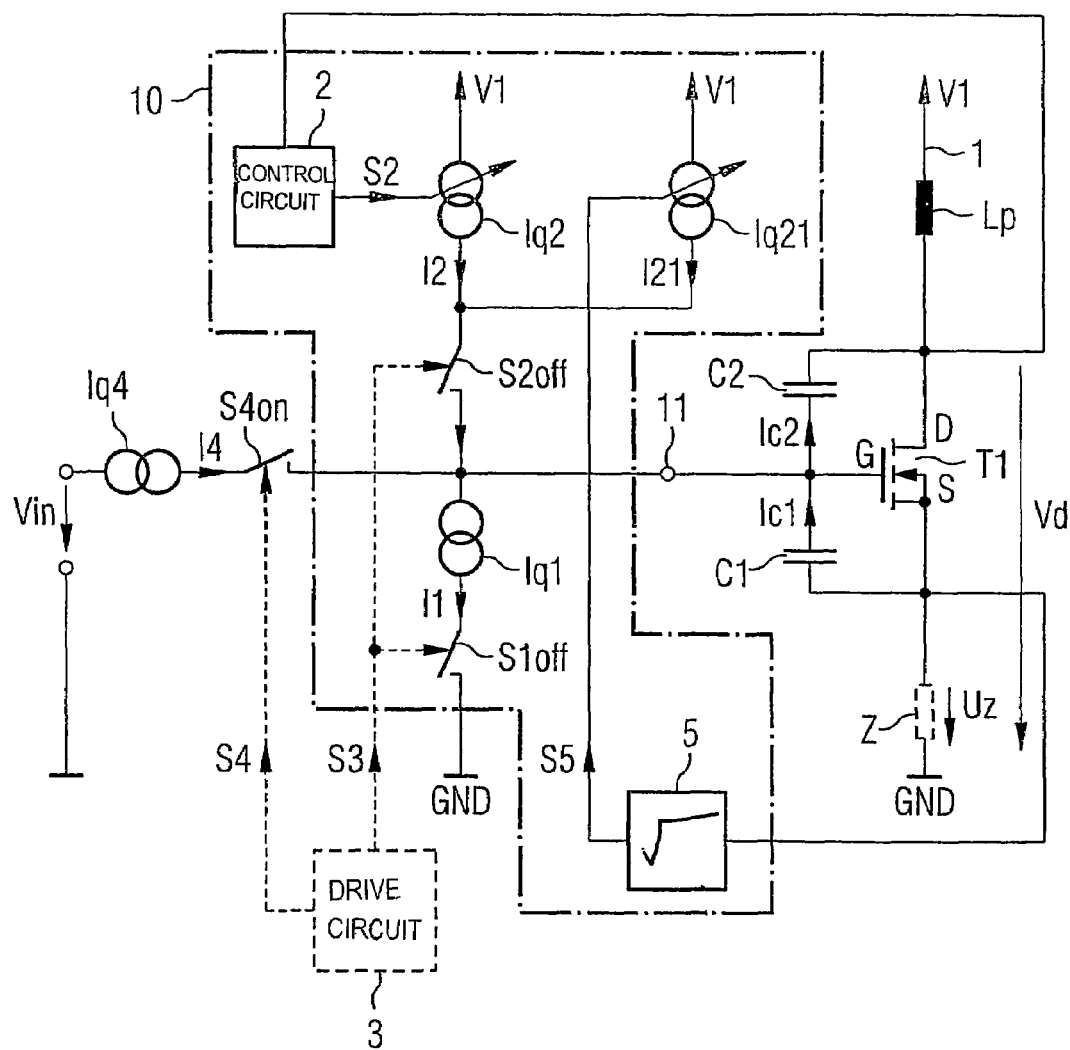
FIG. 7 shows a second exemplary embodiment of a circuit arrangement according to the invention, in which a current source present in the drive unit supplies a current that is dependent on a load voltage.

FIG. 7 shows an exemplary embodiment of the circuit arrangement according to the invention, in which the second current source arrangement of the first drive unit 10 comprises, in addition to the controlled current source Iq2 already explained which supplies a compensation current I2 dependent on the temporal change in the drain potential Vd, a further controlled current source Iq21, which, during the turn-off operation, that is to say when the switch S2off is closed, supplies a current I21 to the output 11 that serves to slow down the discharging of the gate-source capacitance C1 toward the end of the turn-off operation in order thereby to slow down the falling edge of the load current toward the end of the turn-off operation. This further current source is driven by a further drive unit 5 in a manner dependent on a load voltage Uz between the second load path terminal S and reference-ground potential GND. This further drive unit 5 detects said load voltage Uz and generates a drive signal S5, which is related to the load voltage Uz via a nonlinear characteristic curve and to which the current I21 is proportional.

FIG. 8 illustrates this dependence between the load voltage Uz and the current I21. Said current I21 is zero as long as the load voltage Uz is greater than a threshold value Uz0. If said load voltage Uz falls below the threshold value Uz0 during the turn-off operation when the gate-source capacitance C1 is discharged by means of the first current source Iq1, then the current I21 which, as charging current I21, counteracts the discharging current I1 begins to rise nonlinearly as the load voltage Uz decreases in order to increasingly slow down the discharging of the gate capacitance C1 and thereby to achieve a flattening of the load current edge toward the end of the turn-off operation. In this case, the maximum value $I_0$ of this charging current I21 is less than the discharging current I21, so that the gate-source capacitance C1 is always discharged during the turn-off operation. The effective discharging current Ig is illustrated as a function of the load voltage Uz disregarding the compensation I2 in FIG. 8b.

For reasons of completeness, FIG. 7 shows a second drive unit Iq4, S4on, which is connected between a further drive potential Vin and the control terminal G of the power transistor T1. This second drive unit serves for on-state driving of the power transistor T1 and comprises a current source Iq4, which provides a charging current I4, and also a switch S4on driven by a switch-on signal S4. If the switch-on signal S4 assumes a predetermined level that determines a switch-on of the power transistor T1, then said switch S4on is closed in order to charge the gate-source capacitance C1 by means of the charging current I4.

Figure 9:
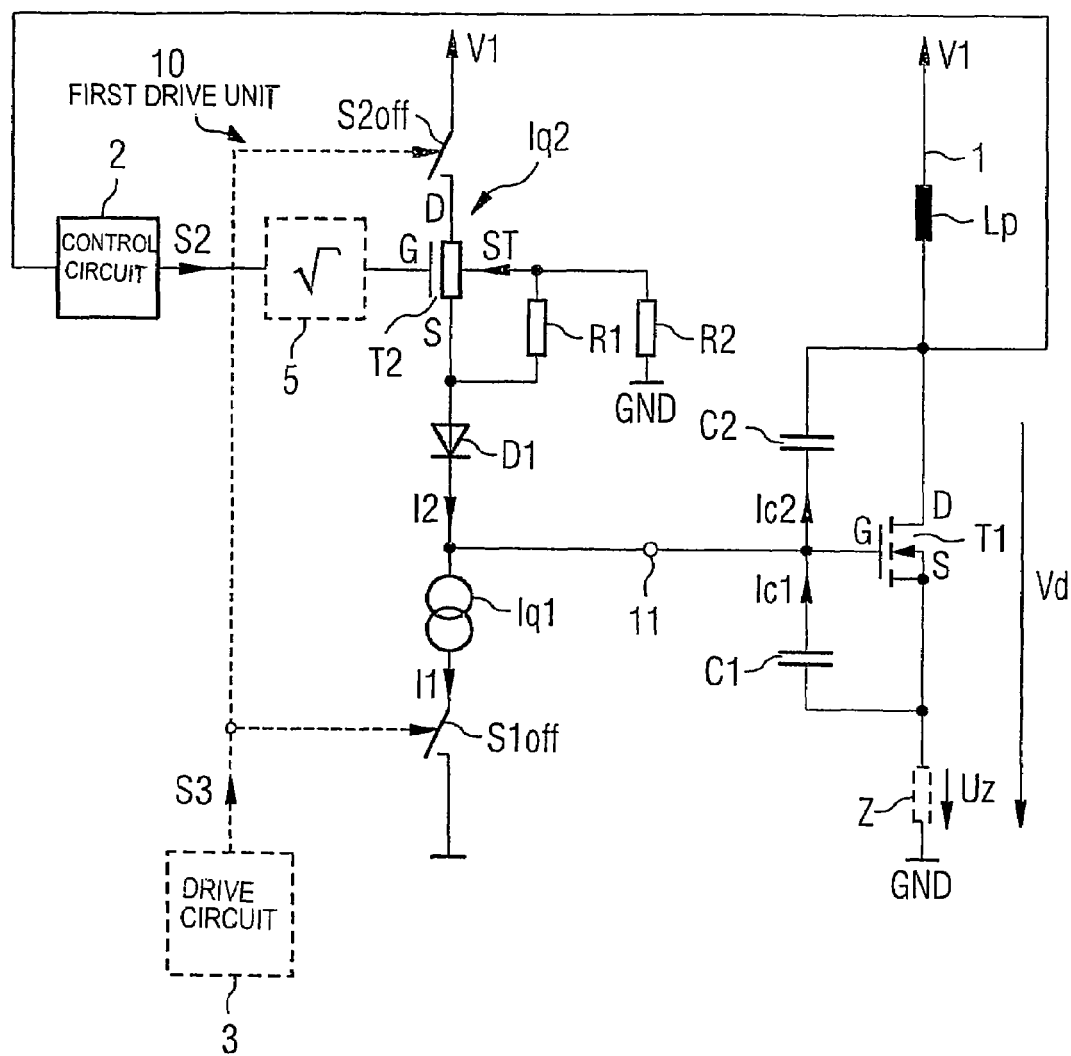
FIG. 9 shows a further exemplary embodiment of the circuit arrangement according to the invention.

FIG. 9 shows an exemplary circuitry realization in which the function of the current sources Iq2, Iq21 connected in parallel in FIG. 7 is fulfilled by a normally on MOSFET T2. Said MOSFET T2 has a gate terminal G, a drain terminal D, a source terminal S and also a substrate terminal ST. In this case, the drain-source path is connected between the positive supply potential V1 and the output 11 of the drive unit 10 or the gate terminal G of the power transistor T1. This normally on MOSFET supplies a compensation current I2 comprising a first and a second current component. In this case, the first current component is dependent on the temporal change in the drain potential Vd. In order to generate this current component, the control signal S2 of the control circuit 2 is fed to the gate terminal G of the MOSFET T2. Since, as is known, the load current of a MOSFET is dependent quadratically on a drive signal present at the gate terminal, the control signal S2 in the present case, a unit 5 that generates on the control signal S2 a signal whose value corresponds to the square root of the control signal S2 is preferably connected between the control circuit 2 and the gate terminal G. The first current component resulting from the gate driving of the MOSFET is thereby proportional to the control signal S2 which is generated in the manner already explained.

A second current component of said MOSFET T2 results from a substrate control of the MOSFET T2. For this purpose, the substrate terminal ST is connected to the source terminal S of the MOSFET T2 via a voltage divider R1, R2. The substrate potential thus follows the source potential of said MOSFET T2, said source potential in turn following the load voltage Uz via the gate-source capacitance C1. If the load voltage falls during the turn-off operation, then the source potential and the substrate potential fall, as a result of which the second current component dependent on the substrate control increases. In this case, this current component is nonlinearly dependent on the load voltage Uz.

In the exemplary embodiments explained above, the second current source arrangement is connected between the output 11 of the first drive unit 10 and the positive supply potential V1. It goes without saying that it is possible to connect said second current source arrangement to an arbitrary positive supply potential which is suitable for the generation of the compensation current I2, or I2, I21 by the controlled current source Iq2 or the controlled current sources Iq2, Iq21.

| List of reference symbols | |
|---|---|
| C1 | Gate-source capacitance |
| C2 | Gate-drain capacitance, Miller capacitance |
| C23 | Capacitive storage element |
| D | Drain terminal |
| D1 | Diode |
| DS2 | Differentiator output signal |
| G | Gate terminal |
| GND | First drive potential, reference-ground potential |
| I1 | Discharging current |
| I2 | Compensation current |
| I21 | Charging current |
| I4 | Charging current |
| Ic1, Ic2 | Discharging currents |
| Ig | Gate current |
| Il | Load current |
| Iq1 | Current source |
| Iq2 | Controlled current source |
| Iq21 | Current source |
| Iq4 | Current source |
| Lp | Parasitic inductance |
| R1, R2 | Voltage divider |
| S | Source terminal |
| S1off, S2off | Switches |
| S2 | Control signal |
| S3 | Switch-off signal |
| S4on | Switch |
| S5 | Control signal |
| T1 | Power transistor |
| T2 | Normally on MOSFET |
| Uz | Load voltage |
| V1 | Second drive potential, positive supply potential |
| V2 | Offset voltage |
| Vd | Drain potential |
| Vin | Drive potential |
| Z | Load |
| 1 | Terminal line |
| 2 | Control circuit |
| 3 | Drive circuit |
| 5 | Unit for determining the square root |
| 5 | Control circuit |
| 10 | First drive unit |
| 11 | Output of the drive unit |
| 21 | Differentiator |
| 22 | Integrator arrangement |
| 23 | Integrator |
| 24 | RS flip-flop |
| 25 | Comparator |
| 26, 29 | Inverters |
| 27, 28, 30 | Switches |

The invention claimed is:

1. A circuit arrangement comprising:
a power transistor having a control terminal and first and second load path terminals, the first load path terminal being connected to a terminal for supply potential via an inductance-exhibiting line and the second load path terminal configured to be connected to a load, and
a first drive unit having an output connected to the control terminal of the power transistor and configured to drive the power transistor in an off-state, the first drive unit having a first current source arrangement connected between the output and a first drive potential, the first drive unit further having a second current source arrangement connected to the output, the second current source arrangement configured to provide a first current that is dependent on an upward integration of a temporal change in a terminal potential at the first load path terminal starting from a time in which a rise in the terminal potential is produced on the inductance-exibiting line.

2. The circuit arrangement as claimed in claim 1, wherein the second current source arrangement is further configured to provide the first current such that the first current is dependent on an upward integration of the temporal change in the terminal potential starting from the time in which the rise in the terminal potential is produced on the inductance-exhibiting line, up to a time at which the load terminal potential reaches a maximum value.

3. The circuit arrangement as claimed in claim 1, wherein the second current source arrangement is connected between the control terminal and a second supply potential.

4. The circuit arrangement as claimed in claim 1, wherein the second current source arrangement is further configured to provide the first current such that the first current is also dependent on a load voltage.

5. The circuit arrangement as claimed in claim 4, the second current source arrangement is further configured to provide the first current such that the first current is related to said load voltage via a nonlinear characteristic curve.

6. The circuit arrangement as claimed in claim 4, wherein the second current source arrangement comprises a first current source configured to provide a first current component dependent on the change in the terminal potential, and a second current source configured to provide a second current component dependent on the load voltage, the first current including the first current component and the second current component.

7. The circuit arrangement as claimed in claim 3, wherein the second current source arrangement includes a depletion transistor having a load path, a control terminal and a substrate terminal, the load path of the depletion transistor being connected between the second supply potential and the output terminal, the control terminal of the depletion resistor configured to receive a first drive signal dependent on the temporal change in the terminal potential, and the substrate terminal configured to receive a second drive signal dependent on the load voltage.

8. The circuit arrangement as claimed in claim 1, wherein the maximum value of the first current is less than a current supplied by the first current source arrangement.

9. The circuit arrangement as claimed in claim 1, further comprising a second drive unit configured to provide on-state driving of the power transistor, the second drive unit having a second drive unit output coupled to the control terminal of the power transistor, the second drive unit including a third current source arrangement connected between the second drive unit output and the first drive potential.

10. A circuit arrangement comprising:
a power transistor having a control terminal and first and second load path terminals, the first load path terminal being connected to a terminal for supply potential via an inductance-exhibiting line and the second load path terminal configured to be connected to a load,
at least a first current source connected between the output and a first drive potential, the first current source switchably coupled to the control terminal and configured to provide a discharge current;
at least a second current source switchably coupled to the control terminal and configured to provide a first current that is dependent on an upward integration of a temporal change in a terminal potential at the first load path terminal starting from a time in which a rise in the terminal potential is produced on the inductance-exibiting line.

11. The circuit arrangement as claimed in claim 10, further comprising a control unit configured to switchably couple the second current source to the control terminal during at least a portion of an off-cycle of the first drive potential.

12. The circuit arrangement as claimed in claim 11, wherein the control unit includes:
- a differentiator operably coupled to the terminal potential of the first load path terminal; and
- an integrator coupled to the differentiator.

13. The circuit arrangement as claimed in claim 12, wherein the integrator further includes:
- an integration circuit coupled to generate a control output signal, the control output signal configured to control a level of the first current generated by the second current source;
- a first switch coupled between the integration circuit and the second current source, the first switch configured to couple the integration circuit and the second current source after the terminal potential at the first load path terminal reaches approximately a maximum value.

14. The circuit arrangement as claimed in claim 13, wherein the integrator further includes a second switch disposed between the integration circuit and the differentiator, the second switch configured to disconnect the integration circuit and the differentiator after the terminal potential at the first load path terminal reaches approximately the maximum value.

15. The circuit arrangement as claimed in claim 12, further comprising a third current source operable to provide an additional component of the first current, the additional component dependent on a load voltage.

16. The circuit arrangement as claimed in claim 15, the second current source arrangement is further configured to provide the additional component such that the additional component is related to said load voltage via a nonlinear characteristic curve.

17. The circuit arrangement as claimed in claim 10, further comprising a third current source operable to provide an additional component of the first current, the additional component dependent on a load voltage.

18. The circuit arrangement as claimed in claim 17, the second current source arrangement is further configured to provide the additional component such that the additional component is related to said load voltage via a nonlinear characteristic curve.

19. The circuit arrangement as claimed in claim 10, wherein the power transistor comprises a MOSFET.

* * * * *